United States Patent [19]
Nishida et al.

[11] Patent Number: 5,240,170
[45] Date of Patent: Aug. 31, 1993

[54] METHOD FOR BONDING LEAD OF IC COMPONENT WITH ELECTRODE

[75] Inventors: Kazuto Nishida, Katano; Kazuhiro Nobori; Yoshifumi Kitayama, both of Hirakata; Keiji Saeki, Kobe, all of Japan

[73] Assignee: Matsushita Electric Industrial Co., Ltd., Osaka, Japan

[21] Appl. No.: 894,650

[22] Filed: Jun. 5, 1992

[51] Int. Cl.⁵ .............................................. H01L 21/58
[52] U.S. Cl. ................................ 228/180.21; 228/212
[58] Field of Search ............... 228/20 R, 6.2, 180.2, 228/212

[56] References Cited

U.S. PATENT DOCUMENTS

| | | |
|---|---|---|
| 4,531,044 | 7/1985 | Chang .............................. 219/121.13 |
| 4,787,548 | 11/1988 | Abbagnaro et al. .................. 228/6.2 |
| 4,979,290 | 12/1990 | Chiba ........................... 228/180.2 X |

FOREIGN PATENT DOCUMENTS 2396  1/1989  Japan ............................ 228/180.2

Primary Examiner—Kenneth J. Ramsey
Attorney, Agent, or Firm—Wenderoth, Lind & Ponack

[57] ABSTRACT

A method for bonding leads of an IC component with electrodes of a circuit board includes the steps of using a mounting device to hold the IC component with flat portions of the leads inclined downward, mounting the IC component on the circuit board at a predetermined position thereof with the IC component held by the mounting device, moving the mounting device toward the circuit board to compress the IC component against the circuit board at the predetermined position while allowing the leads to flex to accommodate for nonuniformity in the heights of metal pieces to be bonded with the electrodes and bending of the circuit board. In this manner, the flat portions of the leads are brought into close contact with the electrodes. The leads are then irradiated with an optical beam so as to melt the metal pieces of the electrodes for bonding of the leads to the circuit board.

6 Claims, 10 Drawing Sheets

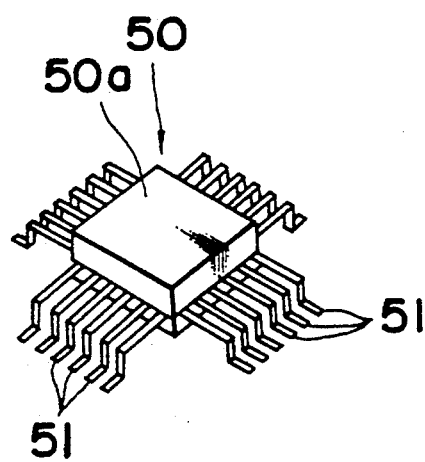
Fig. 15-PRIOR ART

METHOD FOR BONDING LEAD OF IC COMPONENT WITH ELECTRODE

BACKGROUND OF THE INVENTION

The present invention relates to a method for mounting an IC component on a circuit board and bonding a lead of the IC component with an electrode of the circuit board.

In mounting an IC component on a circuit board and bonding leads of the IC component with electrodes of the circuit board, the IC component 50 in which leads 51 project from a main body 50a is held in position in a predetermined tray, as shown in FIG. 15. Then, the tray is supplied to a component mounting apparatus. A mounting head 52 of the component mounting apparatus holds the IC component 50 held in the tray as shown in FIG. 14. Thereafter, an adhesive agent 54 is applied to the circuit board 53 at the mounting position for the IC component, and cream solder 56 is applied to each electrode 55 to be bonded with the leads 51. Then, the IC component 50 is mounted on circuit board 53 at the predetermined IC component mounting position. The adhesive agent 54 is used to temporarily fix the IC component 50 to the IC component mounting position. The circuit board 53 on which the IC component 50 has been mounted is inserted into a reflux oven to melt the cream solder 56. Thus, the leads 51 are bonded with the electrodes 55 with solder.

According to the above-described bonding method, the IC component 50 is supported by the fluid adhesive agent 54 and the cream solder 56 after the IC component 50 is mounted on the circuit board 53. Therefore, as the pitch of the leads 51 of the IC component 50 becomes smaller, the IC component 50 is moved slightly by the behavior of the adhesive agent 54 or that of the cream solder 56 which occurs immediately after the IC component 50 is mounted on the circuit board 53 and the acceleration and vibration of the circuit board 53 during the movement thereof. As a result, the leads 51 fall off the cream solder 56, thus causing an unfavorable connection between the leads 51 and the electrodes 55. In addition, even if the leads 51 are released only slightly from the circuit board 53, the leads 51 are bonded with the electrodes 55 in an unfavorable manner. Further, a reflux process for bonding the leads 51 with the electrodes 55 is required. That is, this method requires many processes and is, hence, low in its productivity.

SUMMARY OF THE INVENTION

It is an essential object of the present invention to provide a method for bonding a lead of an IC component with an electrode of a circuit board with high reliability and high productivity.

In accomplishing this and other objects, according to one aspect of the present invention, there is provided a method for bonding leads of an IC component with electrodes of a circuit board, comprising the steps of:

using a mounting device to hold the IC component with flat portions of the leads in their normally downwardly inclined postures;

mounting the IC component on the circuit board at a predetermined position thereof with the mounting device;

operating the mounting device to compress the IC component against the circuit board at the predetermined position and allowing the leads to flex to accommodate for nonuniformity in the heights of metal pieces to be bonded with the electrodes and to accommodate bending of the circuit board, so that flat portions of the leads are brought into close contact with the electrodes; and irradiating the leads with an optical beam so as to melt the metal pieces of the electrodes.

According to the method for bonding the leads of the IC component with the electrodes of the circuit board, the leads are heated by being irradiated with the optical beam while the mounting device compresses the IC component against the circuit board at a predetermined position thereof. The leads of the IC component are formed so that the flat portions of the leads from the bending points thereof to the free ends thereof are inclined downwardly. Therefore, the IC component does not dislocate after it is mounted on the circuit board, such the lead can be reliably bonded with the electrode. In addition, the flexure of the leads accommodates the bending of the circuit board, the nonuniformity in the height of the metal pieces to be bonded with the leads, and the nonuniformity in the configurations of the leads. Thus, the leads can be favorably bonded with the electrodes. Further, since the leads are bonded with the electrodes in the mounting process and a series of processes, the method of the present invention is productive.

BRIEF DESCRIPTION OF THE DRAWINGS

These and other objects and features of the present invention will become clear from the following description taken in conjunction with the preferred embodiments thereof with reference to the accompanying drawings, in which:

FIG. 15 is a perspective view showing a conventional IC component.

DETAILED DESCRIPTION OF THE INVENTION

Figure 1:
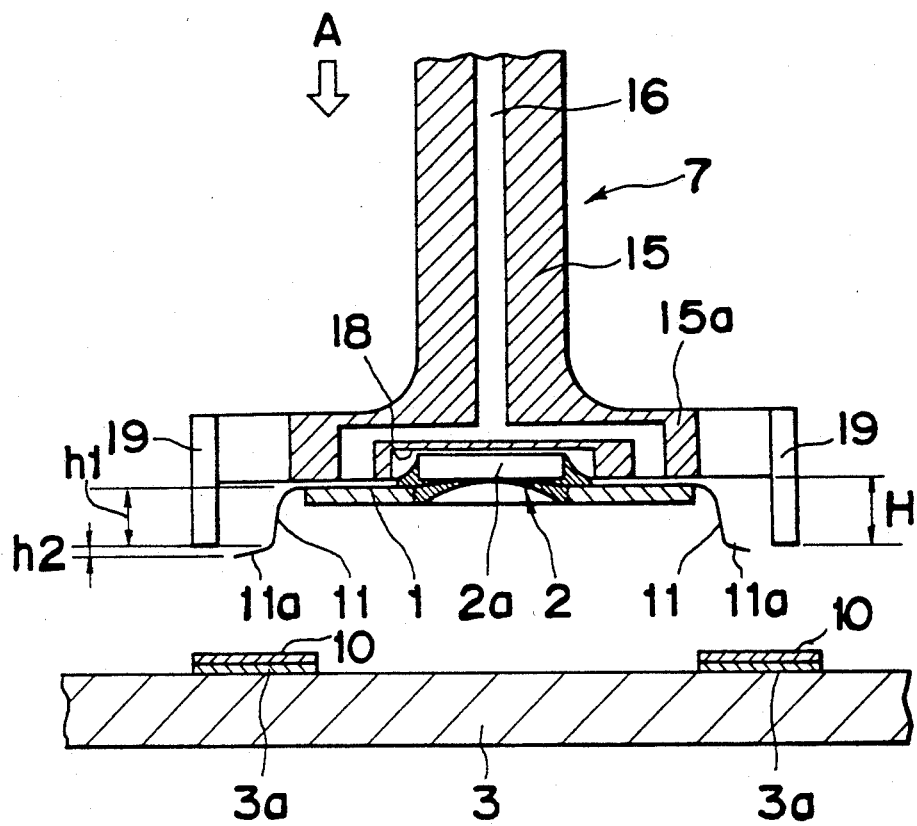
FIG. 1 is a vertical sectional view showing a condition immediately before leads of an IC component are bonded with electrodes of a circuit board according to a first embodiment of the present invention.

Before the description of the present invention proceeds, it is to be noted that like parts are designated by like reference numerals throughout the accompanying drawings.

Referring now to FIGS. 1 through 13, the embodiments of the present invention will be described below. In the embodiments, IC components integrally mounted on a carrier film are separated therefrom so as to mount them on a circuit board.

A first embodiment of the present invention is described below with reference to FIGS. 1 through 4, 11, 12, and 13.

Figure 13:
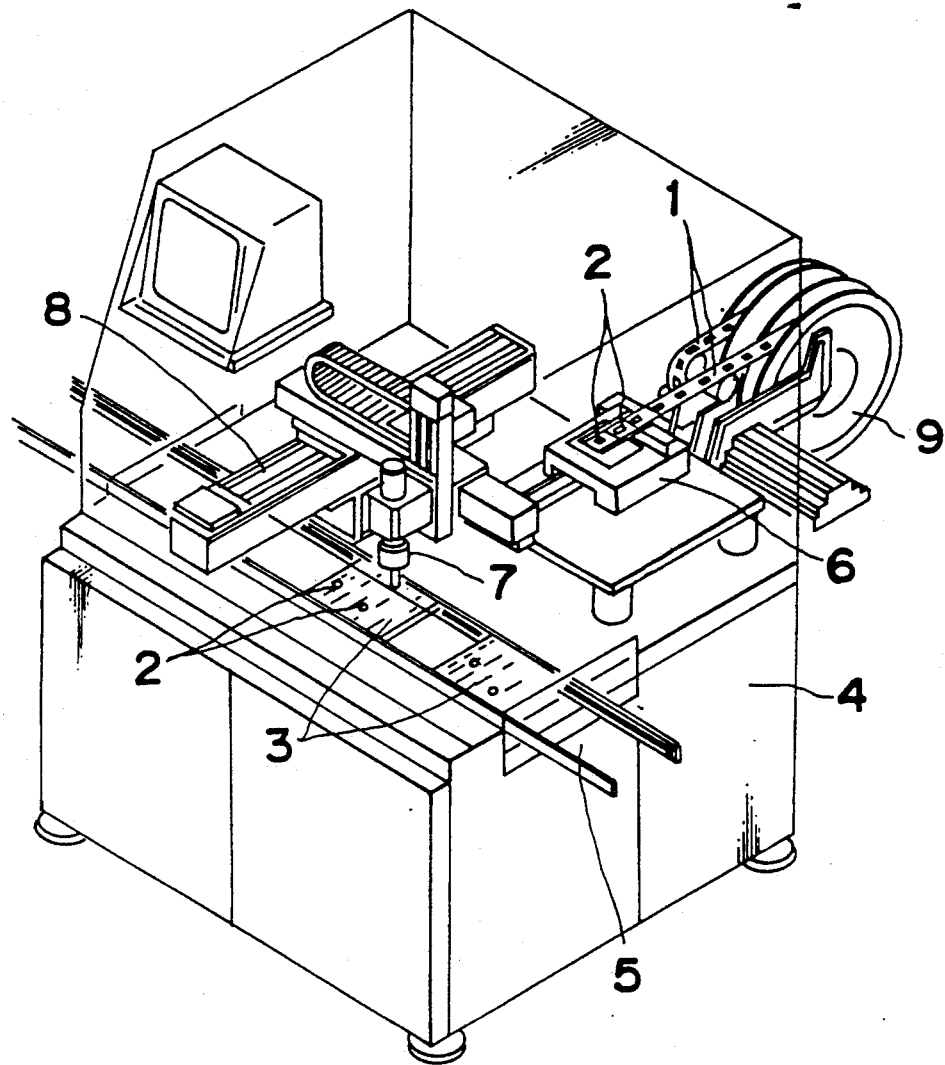
FIG. 13 is a schematic perspective view showing the entire construction of an IC component mounting apparatus.
Figure 14:
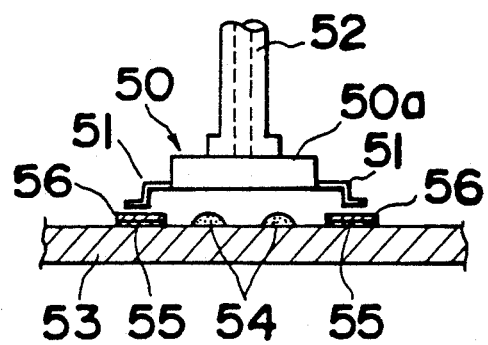
FIG. 14 is a front view showing a conventional process for bonding a lead of an IC component with an electrode.

Referring to FIG. 13 showing the entire construction of the IC component mounting apparatus, there are provided, at a front portion of the upper surface of a main body 4 of the apparatus, a board transporting means 5 for transporting and placing a printed circuit board 3 in position; and, at a rear portion of the upper surface of the main body 4, a cutting means 6 for cutting and separating IC component 2 from a carrier film 1. There is provided between the cutting means 6 and the board transporting means 5 an X-Y robot 8 for moving a mounting head 7 capable of holding one of the IC components 2 between the cutting means 6 and a given position of the printed circuit board 3. There is provided behind the main body 4 a supply means 9 for supplying the carrier film 1 having the IC components 2 integrally formed thereon to the cutting means 6.

The IC components 2 are integrally formed on the carrier film 1 at regular intervals in the longitudinal direction thereof. That is, inner leads and outer leads are previously formed on the carrier film 1. The bump of an IC tip mounted on the carrier film 1 and the inner leads are bonded with each other so as to seal the carrier film 1, the IC tip, and the inner leads integrally with resin.

Figure 12:
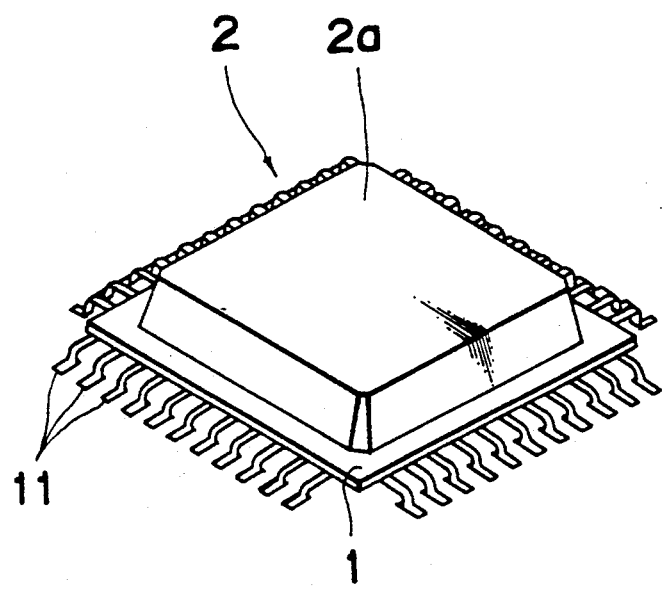
FIG. 12 is a perspective view showing an IC component.

Thus, the main body 2a of the IC component 2 and the outer leads 11 projecting from the four sides of the carrier film 1 positioned in the periphery of the main body 2a are formed as shown in FIG. 12.

Figure 2:
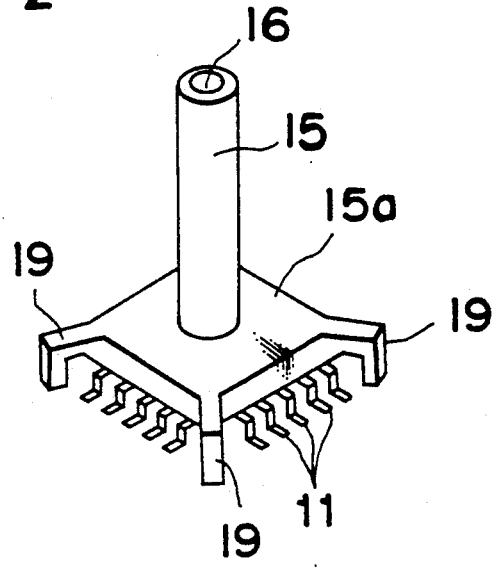
FIG. 2 is a perspective view showing a condition in which an IC component is held by a suction nozzle.
Figure 11:
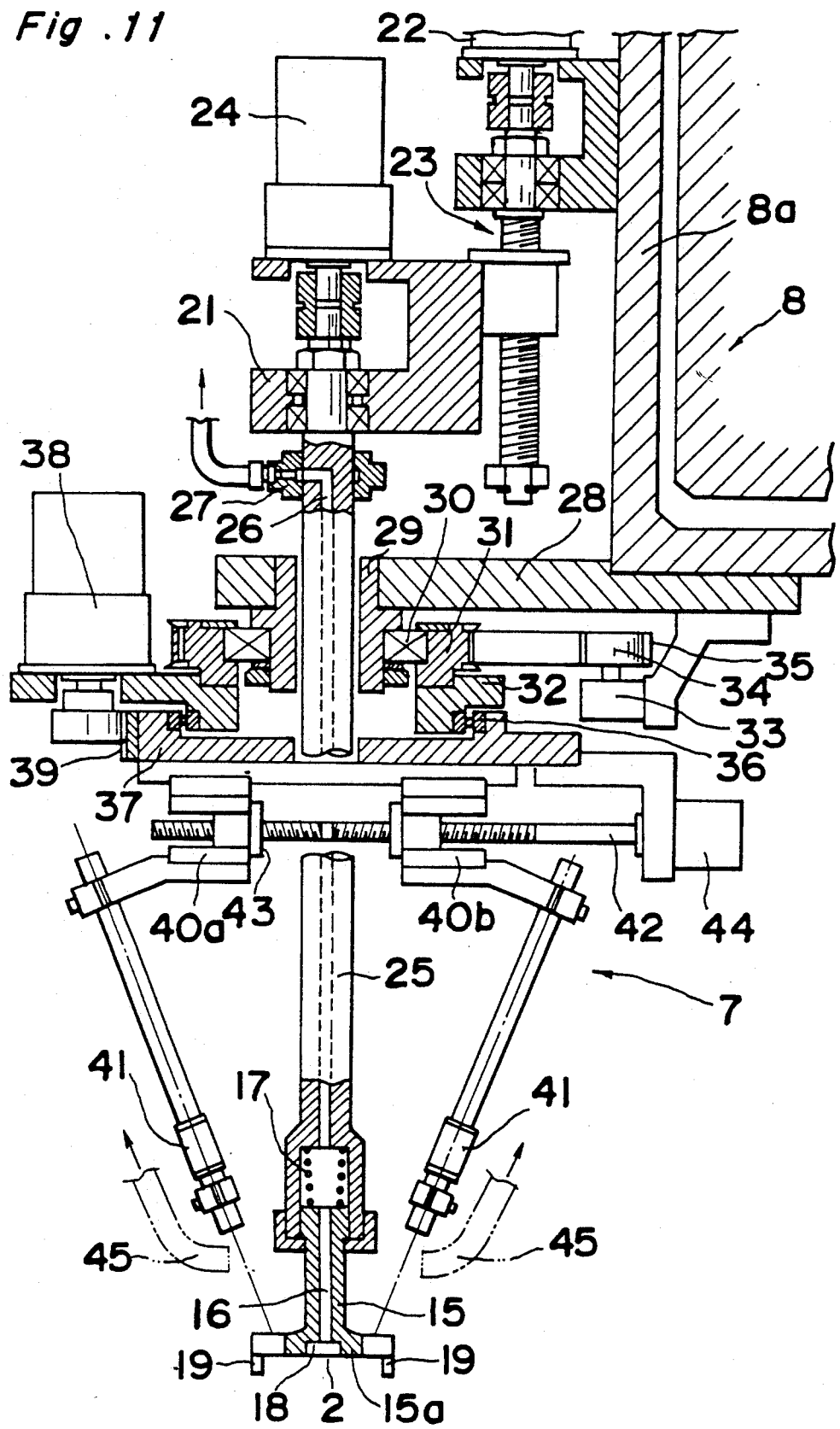
FIG. 11 is a vertical sectional view showing a mounting head.

As shown in FIG. 11, the IC component holding portion of the mounting head 7 comprises a suction nozzle 15 urged downward by a spring 17, the nozzle 15 having a suction hole 16 formed along the axis thereof. The lower end 15a of the nozzle 15 is in approximately the same configuration in plan view as the carrier film 1 at the periphery of the main body 2a. A concave 18 into which the main body 2a of the IC component 2 is inserted is formed on the lower end 15a of the nozzle 15. Stoppers 19 project downward from the four corners of the lower end 15a as shown in FIG. 2.

Figure 4:
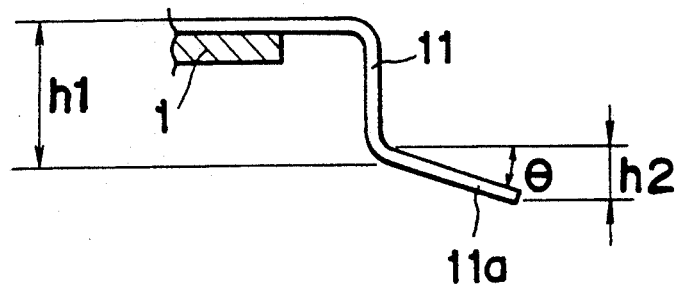
FIG. 4 is an enlarged view showing the configuration of a lead of an IC component.

A die of the cutting means 6 is constructed as follows. After the carrier film 1 is cut, the base portion of each lead 11 of the IC component is bent so that the bending point (or elbow) of the flat portion 11a of the lead 11 is positioned to be lower than the base portion by a distance (h1) so that the flat portion 11a makes an angle of $\theta$ with the base portion, as shown in FIG. 4. That is, the lower end (or free end) of the lead 11 is lower than the bending point by a distance (h2).

The construction of the mounting head 7 is described below with reference to FIG. 11. There is provided in a movable portion 8a of an X-Y robot 8 an elevator 21 to be moved vertically by a motor 22 and a feeding screw mechanism 23. A shaft 25 extends downward from the elevator 21, and the nozzle 15 mounted on the lower end of the shaft 25 is urged downward by the spring 17. The shaft 25 is attached to the elevator 21 so that the shaft 25 is rotatable about its axis and can be stopped at any rotational position by a motor 24. A suction passage 26 communicating with the suction hole 16 of the nozzle 15 is formed along the axis of the shaft 25 and connected with a suction source (not shown) through a swivel fitting 27 provided on an upper portion of the shaft 25.

A bracket 28 is fixed to the movable portion 8a. The shaft 25 penetrates through a through hole of a cylinder 29 provided on the bracket 28, the shaft 25 being concentrical with the through hole of the cylinder 29. A pulley 31 is rotatably mounted on the cylinder 29 through a bearing 30. A rotary frame 32 is fixed to the pulley 31. The pulley 31 is rotated by a motor 33 fixed to the bracket 28 through a driving pulley 34 and a toothed belt 35.

A movable member 37 is linearly movably mounted on the rotary frame 32 through a slide bearing 36 and driven by a motor 38 fixed to the rotary frame 32 and a rack-and-pinion mechanism 39.

There is provided on the movable member 37 a pair of interval adjusting members 40a and 40b movable with respect to the axis of the shaft 25 in the direction perpendicular to the moving direction of the movable member 37. There is provided on the interval adjusting members 40a and 40b a laser beam irradiating means 41 for irradiating laser beams through the nozzle 15 to the leads 11 of the IC component 2 mounted on the substrate 3 by being held by the nozzle 15.

The interval adjusting members 40a and 40b are synchronously driven by a feeding screw mechanism 43 comprising a feeding screw shaft 42 which is threaded in opposite directions with respect to the axis of the shaft 25 and an interval adjusting motor 44 for rotatably driving the feeding screw shaft 42. There is provided in the vicinity of the laser beam irradiating means 41 a gas jetting means 45 for blowing off flux smoke generated in bonding the lead 11 with the bump of the circuit board 3 by means of laser beams.

The operation for mounting an IC component on a circuit board is described below.

The supply means 9 supplies the carrier film 1 to the cutting means 6 as shown in FIG. 13. The mounting head 7 is placed in position in front of the cutting means 6. The IC component 2 is separated from the carrier film 1 by the operation of an unshown driving means of the cutting means 6 and the leads 11 are shaped as shown in FIGS. 4 and 12. Then, the lower portion of the die of the cutting means 6 slides toward the mounting head 7, and the IC component 2 is positioned in a suction portion of the main body of the apparatus.

Then, the motor 22 drives the nozzle 15 downward by driving the elevator 21 and the shaft 25 downward. As a result, the shaped IC component 2 is attracted by suction from the nozzle 15.

Then, the motor 22 is driven in the opposite direction, and the nozzle 15 is moved upward by the elevator 21 and the shaft 25. Then, the X-Y robot 8 is driven and the mounting head 7 is moved toward the circuit board 3 placed in position by the board transporting means 5 so that the mounting head 7 is positioned immediately above the IC component mounting position.

As shown in FIG. 1, a metal junction piece 10 is provided on each electrode 3a, made up of copper in pattern, which is to be bonded with each lead 11 of the IC component 2. The metal piece 10 is formed by applying cream solder to the substrate 3 and then reflowing the cream solder or performing a solder plating process or a solder dipping process.

Then, the elevator 21 is moved downward by the motor 22 and the nozzle 15 is moved downward by the shaft 25 as shown by an arrow (A) of FIG. 1, thus mounting the IC component 2 on the substrate 3. Then, the nozzle 15 moves upward a predetermined amount against the urging force of the spring 17 and stops. Thus, as shown by an arrow (B) of FIG. 3, the IC component 2 is fixed to the predetermined position of the substrate 3 by the pressure applied by the urging force of the spring 17. The mounting posture of the IC component 2 is adjusted by rotating the shaft 24 by means of the motor 24.

Then, the laser beam irradiating means 41 irradiates the leads 11 of the IC component 2 projecting within the periphery of the nozzle 15 along optical paths as shown by arrows (C). As a result, each metal 10 is melted and each lead 11 is bonded with each electrode 3a.

In bonding the leads 11 with the electrodes 3a by irradiation from the laser beams, the moving member 37 is linearly moved with the laser beam irradiating means 41 irradiating and scanning the leads 11 along two parallel sides of the IC component 2. As a result, the leads 11 of each parallel side of the IC component 2 are bonded with the electrodes 3a at one time. Then, the motor 33 rotates the rotary frame 32 by 90° and the moving member 37 is moved with the laser beam irradiating means 41 irradiating the leads 11. Thus, the leads 11 on each of the remaining parallel sides of the IC component 2 are bonded with the electrodes 3a.

The IC component 2 is scanned by the laser beams upon the linear movement of the moving member 37 and irradiated by the laser beam irradiating means 41 under the following conditions. An interval which can be scanned at a constant speed coincides with the bonding range of the leads 11. The leads 11 are pre-heated at the start of scanning to uniformly bond the leads 11 with the electrodes 3a by starting the irradiation of the leads 11 at the beginning of a scanning-initiated interval before the IC component 2 is scanned by the laser beams. In addition, in order to prevent the substrate 3 from being excessively heated in the later period of the scanning, the scanning speed may be increased in the later period of the scanning or the output of the laser beam irradiating means 41 may be gradually decreased.

In this manner, all the leads of the IC component 2 are bonded with the electrodes 3a of the substrate 3. Thus, the IC component 2 is mounted on the substrate 3 at a predetermined position thereof. The IC components 2 are sequentially mounted on the substrates 3 by repeating the above operation.

Figure 3:
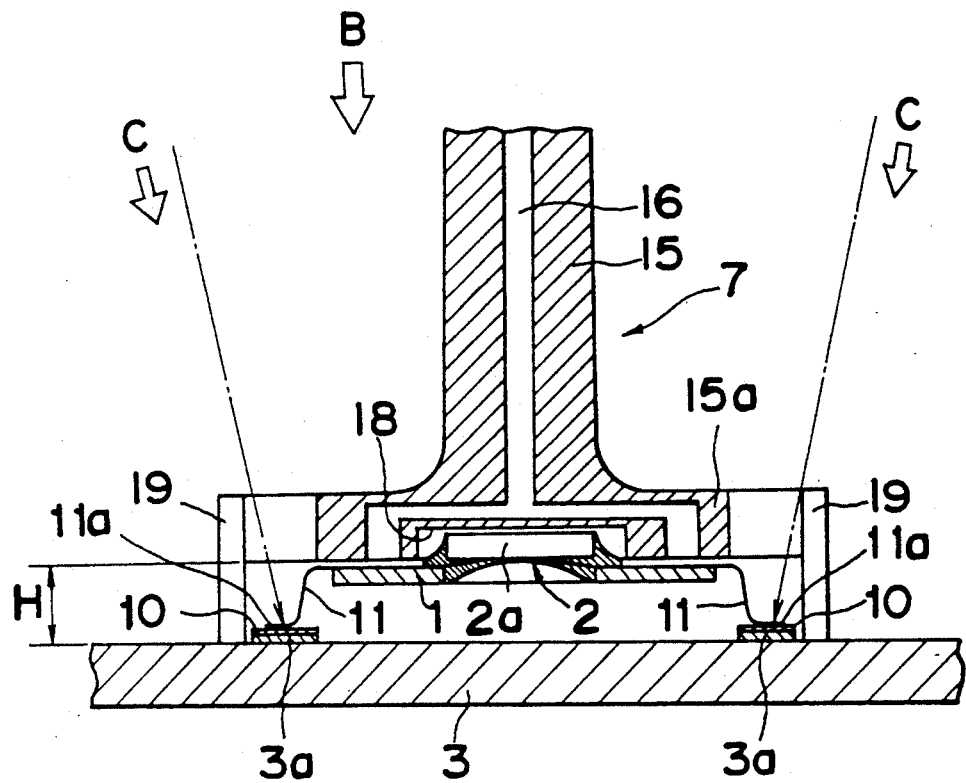
FIG. 3 is a vertical sectional view showing a condition in which leads of an IC component are bonded with electrodes.

As described previously with reference to FIG. 4, the bending point of the base portion of each lead 11 is positioned to be lower than the base portion by a distance (h1), and the flat portion 11a makes an angle of $\theta$ with the base portion. That is, the lower end of the lead 11 is lower than the bending point by a distance (h2). The distance (H) between the lower surface of the lower end portion 15a of the nozzle 15 and the lower surface of the stopper 19 is set to be the sum of the height (h1) of the lead 11 and the height of the electrode 3a of the substrate 3. Therefore, with the change of the IC component 2 from the condition in which the IC component 2 is sucked toward the nozzle 15 as shown in FIG. 1 to the condition in which the IC component 2 is pressed against the substrate 3 as shown in FIG. 3, the height of each lead 11 changes from (h1+h2) to (h1) when the leads 11 have been bonded with the electrodes 3a. That is, with the flexure of the flat portion 11a of the lead 11 changing from $\theta$ to almost 0°, the nonuniformity of the height of the metal piece 10 and the bending of the substrate 3 are absorbed. Thus, the leads 11 are capable of reliably contacting the electrodes 3a and favorably bonding therewith.

Figure 5:
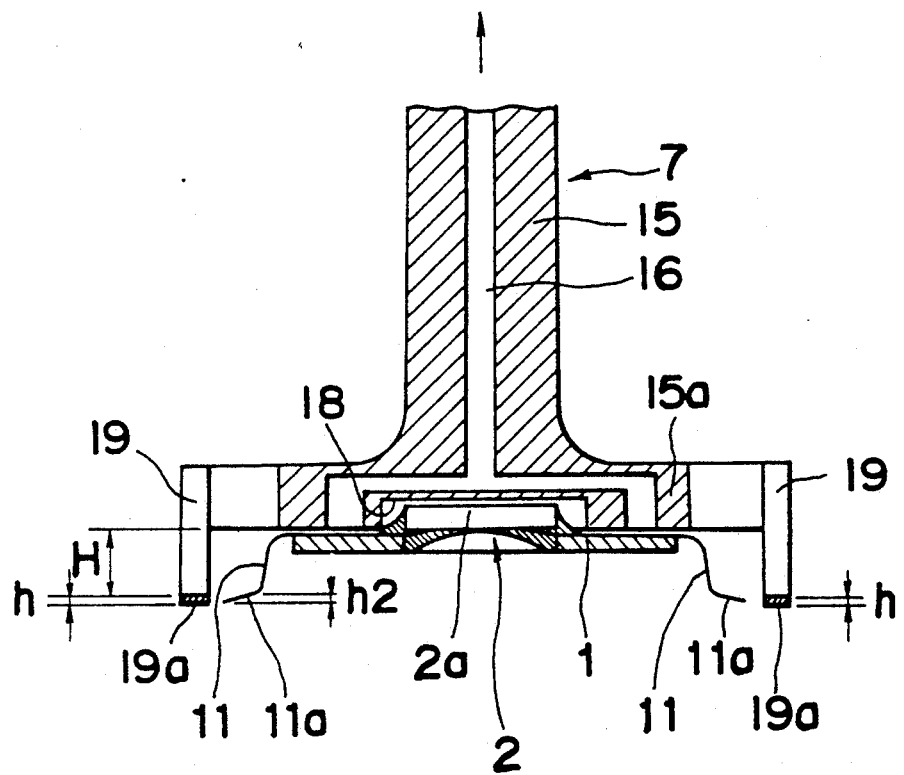
FIG. 5 is a vertical sectional view showing a condition in which an IC component is held by a suction nozzle according to a second embodiment of the present invention.

A second embodiment of the present invention will be described below with reference to FIG. 5. An elastic member 19a is fixed to the lower end of each stopper 19 of the nozzle 15. The elastic member 19a is vertically compressible by a distance (h) which is designed to be almost equal to the height (h2) of the flat portion 11a of the lead 11.

With the flexure of the flat portion 11a of the lead 11 from $\theta$ to almost 0°, the nonuniformity of the height of the metal piece 10 and the bending of the substrate 3 are absorbed. In addition, the leads 11 can be brought into close contact with the electrodes 3a by the cushioning effect of the elastic members 19a. Thus, the leads 11 can be reliably bonded with the electrodes 3a without the leads 11 being dislocated or bent.

Figure 6:
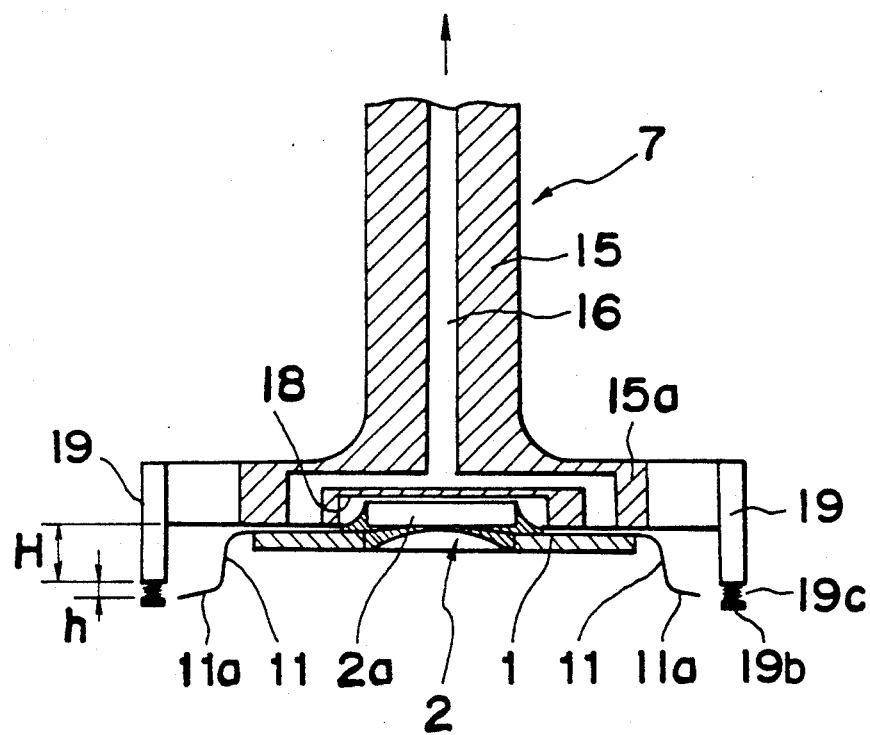
FIG. 6 is a vertical sectional view showing a condition in which an IC component is held by a suction nozzle according to a third embodiment of the present invention.

A third embodiment of the present invention is described below with reference to FIG. 6. Instead of the elastic member 19a of the second embodiment, a contact member 19b urged downwardly by a spring 19c is mounted on the lower end of each stopper 19. Each contact member 19b is elastically compressible by a distance (h). The third embodiment has an operation similar to that of the second embodiment.

A fourth through a seventh embodiment of the present invention are described below with reference to FIGS. 7 through 10. In these embodiments, the leads 11 are pressed by a thin plate.

Figure 7:
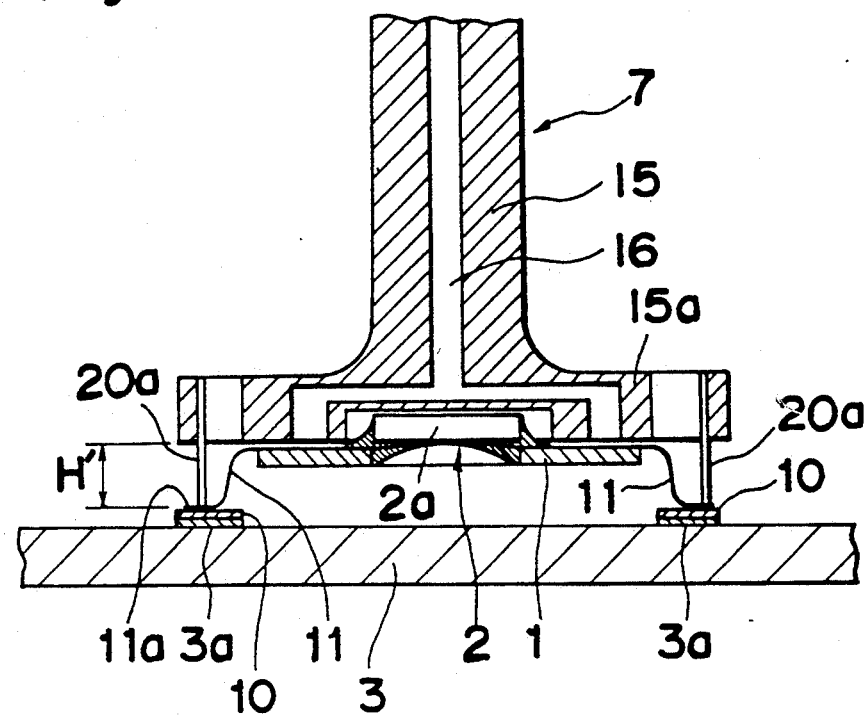
FIG. 7 is a vertical sectional view showing a condition in which an IC component is held by a suction nozzle according to a fourth embodiment of the present invention.

The fourth embodiment is described below with reference to FIG. 7. Four outer pressurizing thin plates 20a for pressing the lower ends 11a of the leads 11 downward are vertically mounted on the periphery of the nozzle 15. The distance (H') between the lower surface of the nozzle 15 and the lower end surface of each thin plate 20a is set to be equal to the height (h1) of the lead 11. According to this construction, since the flat portions 11a of the leads 11 are directly compressed by the thin plates 20a, the leads 11 can make reliable contact with the electrodes 3a and can therefore be bonded therewith favorably.

Figure 8:
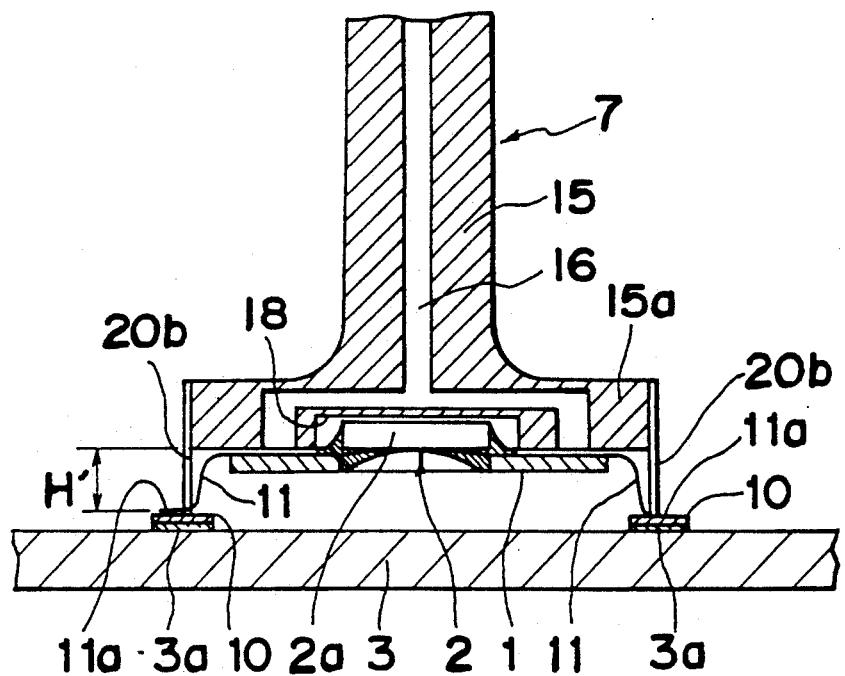
FIG. 8 is a vertical sectional view showing a condition in which an IC component is held by a suction nozzle according to a fifth embodiment of the present invention.
Figure 9:
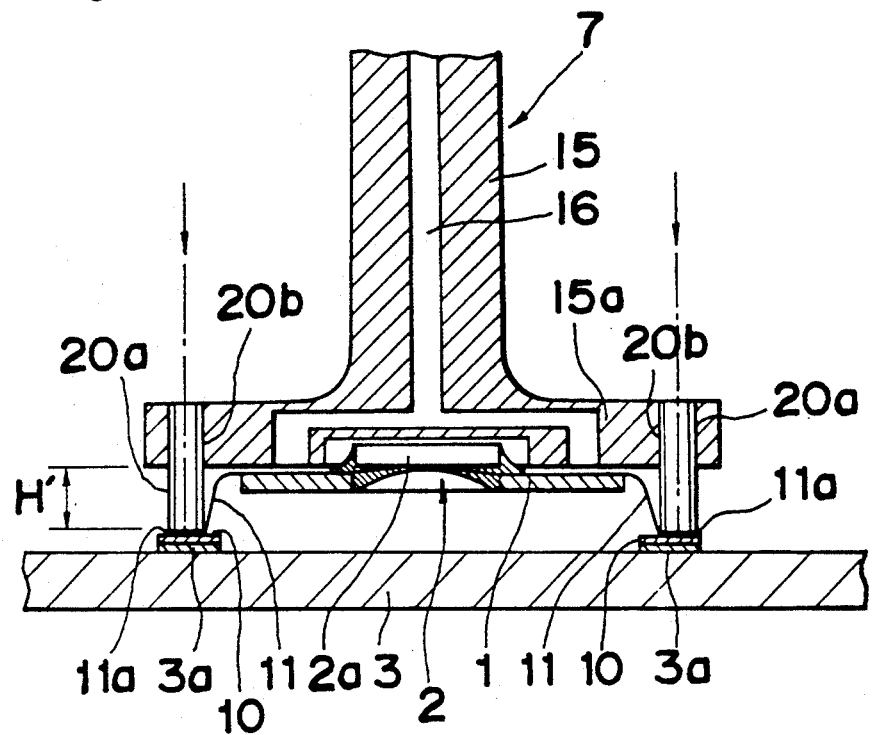
FIG. 9 is a vertical sectional view showing a condition in which an IC component is held by a suction nozzle according to a sixth embodiment of the present invention.

The fifth and sixth embodiments are described below with reference to FIGS. 8 and 9, respectively. According to the fifth embodiment shown in FIG. 8, four inner pressurizing thin plates 20b are mounted on the nozzle 15 for pressing against the base ends of the flat portions 11a of the leads 11. According to the sixth embodiment shown in FIG. 9, both the thin plates 20a and the thin plates 20b are mounted on the nozzle 15. The operation of the fifth and sixth embodiments is essentially the same as that of the fourth embodiment.

Figure 10:
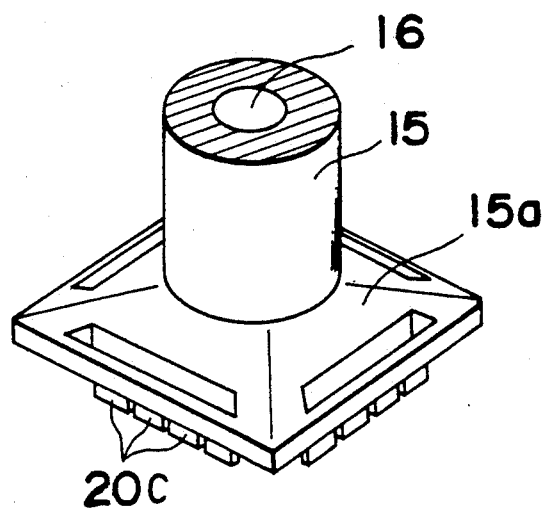
FIG. 10 is a perspective view showing a suction nozzle according to a seventh embodiment of the present invention.

The seventh embodiment is described below with reference to FIG. 10. Pressurizing thin plates 20c, divided at regular intervals, and urged by a spring (not shown) are mounted on the nozzle 15. This construction allows the leads 11 to be adaptable to the bending of the circuit board 3 and eliminates the need to make the lower end surfaces of the pressurizing thin plates flush with each other.

According to the first through the seventh embodiments, laser beams are used. However, other optical beams such as infrared rays may be utilized instead of the laser beams to heat the leads 11.

In scanning the leads 11 by utilizing laser beams, a reflection mirror may be used instead of the movable member 37. A cylindrical lens may be added to the laser beam irradiating means 41 so as to make the irradiation range of the optical beams coincide with the bonding range of the leads 11. Thus, the leads 11 can be heated at one time.

According to the first through the seventh embodiments, the IC component 2 is separated from the carrier film 1 on which the IC component 2 is integrally formed, and is then shaped into a predetermined configuration so as to mount it on the circuit board 3. However, the IC component 2 may be supplied to the circuit board 3 by any desired method.

According to the method for bonding the leads of the IC component with the electrodes of the circuit board, the leads are heated by optical irradiation of the IC component to electrically connect the electrodes with the IC component which is sucked against and pressurized by the mounting head at a predetermined position of the circuit board. Therefore, the IC component does not become dislocated after it is mounted on the circuit board, such that the leads can be favorably bonded with the electrodes. In addition, since the leads are flexed against the metal piece, the leads can be brought into close contact with the electrodes even of the heights of the metal pieces to be bonded with the leads are varied or the circuit board is flexed. Thus, the leads can be prevented from being moved upward and can be reliably bonded with the electrodes. Further, since the leads are bonded with the electrodes in the mounting process and a series of processes, the method of the present invention is productive.

In addition, since the stoppers provided on the mounting head apply pressure to the leads without changing the configuration of the IC component, the leads can be bonded with the electrodes reliably.

Furthermore, the elastic members or the contact members urged by springs are provided on the stoppers. Accordingly, the cushioning effect of the elastic members or the contact members brings the leads into close contact with the electrodes of the circuit board and, as such, the leads ca be bonded with the electrodes without the leads being dislocated or bent.

When the mounting head having the pressurizing thin plates corresponding to the configuration of the IC component in plan view are used, the leads are irradiated with the leads fixed to the electrodes under pressure by the thin plates. Therefore, the leads can be bonded with the electrodes reliably.

Although the present invention has been fully described in connection with the preferred embodiments thereof with reference to the accompanying drawings, it is to be noted that various changes and modifications will be apparent to those skilled in the art. Such changes and modifications are to -be understood as included within the scope of the present invention as defined by the appended claims unless they depart therefrom.

What is claimed is:

1. A method for bonding leads of an IC component with electrodes of a circuit board, comprising the steps of:

holding the IC component with a mounting device with flat portions of the leads normally inclined downward;

operating the mounting device to mount the IC component on the circuit board at a predetermined position thereof;

operating the mounting device to compress the IC component on the circuit board at said predetermined position such that the leads flex to absorb nonuniformity of heights of the electrodes and bending of the circuit board so that the flat portions of the leads are brought into close contact with the electrodes;

irradiating the leads with an optical beam so as to melt metal parts of the electrodes;

wherein in the mounting and compressing steps, the mounting device has a stopper corresponding to a height of the IC component; and wherein the stopper has an elastic member which contracts to a vertical position corresponding to the height of the IC component.

2. A method for bonding leads of an IC component with electrodes of a circuit board, comprising the steps of:

holding the IC component with a mounting device with flat portions of the leads normally inclined downward;

operating the mounting device to mount the IC component on the circuit board at a predetermined position thereof;

operating the mounting device to compress the IC component on the circuit board at said predetermined position such that the leads flex to absorb nonuniformity of heights of the electrodes and bending of the circuit board so that the flat portions of the leads are brought into close contact with the electrodes;

irradiating the leads with an optical beam so as to melt metal parts of the electrodes;

wherein in the mounting and compressing steps, the mounting device has a stopper corresponding to a height of the IC component; and wherein the stopper has a contact member urged by a spring, the contact member contracting to a vertical position corresponding to the height of the IC component.

3. A method for bonding a lead of an IC component with an electrode of a circuit board, comprising the steps of:

holding the IC component with a mounting device having a compressing means comprising a thin plate which is smaller than the lead in plan view;

mounting the IC component on the circuit board at a predetermined position thereof with the mounting device;

vertically compressing the lead toward the electrode with the compressing means; and irradiating the lead with an optical beam so as to melt a metal part of the electrode.

4. A method comprising the steps of:

providing a circuit board having electrodes with metal parts;

providing an IC component which includes leads having base portions and flat portions flexibly connected to said base portions at elbow portions, respectively, such that said flat portions are normally downwardly inclined and adapted to be flexed upwardly into a compressed posture;

providing a mounting device comprising a main body adapted to hold said IC component, and a stopper which extends downwardly from said main body a distance corresponding to a height of said IC component in such a manner that said stopper limits the extent to which said IC component can be lowered toward said circuit board by said mounting device, such that, when said IC component is lowered toward said circuit board by said mounting device to the extent allowed by said stopper, said leads of said IC component will be flexed into but not beyond said compressed posture;

operating said mounting device to mount said IC component on said circuit board in a predetermined position and to compress said IC component against said circuit board to an extent allowed by said stopper, such that said leads of said IC component are flexed into said compressed posture with said flat portions of said leads closely contacting said electrodes of said circuit board, respectively; and irradiating each of said leads of said IC component with an optical beam to melt said metal parts of said electrodes for bonding of said leads with said electrodes, respectively.

5. A method as recited in claim 4, wherein said stopper includes a vertically contractible elastic member which is contractible to a vertical position corresponding to a vertical position of said flat portions of said leads when said IC component is held by said mounting device and said leads are in said compressed posture.

6. A method as recited in claim 5, wherein said stopper includes a vertically contractible contact member and a spring urging said contact member downwardly, said contact member being contractible to a vertical position corresponding to a vertical position of said flat portions of said leads when said IC component is held by said mounting device and said leads are in said compressed posture.

* * * * *